United States Patent
Weng

(10) Patent No.: US 11,928,412 B2
(45) Date of Patent: Mar. 12, 2024

(54) METHOD

(71) Applicant: CHANGXIN MEMORY TECHNOLOGIES, INC., Hefei (CN)

(72) Inventor: Kun Weng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 324 days.

(21) Appl. No.: 17/505,681

(22) Filed: Oct. 20, 2021

(65) Prior Publication Data
US 2022/0100940 A1    Mar. 31, 2022

Related U.S. Application Data

(63) Continuation of application No. PCT/CN2021/107970, filed on Jul. 22, 2021.

(30) Foreign Application Priority Data

Sep. 30, 2020   (CN) .......................... 202011062989.0

(51) Int. Cl.
| | |
|---|---|
| G06F 30/3323 | (2020.01) |
| G06F 30/3308 | (2020.01) |
| G06F 30/337 | (2020.01) |
| G06F 30/367 | (2020.01) |
| G06F 30/398 | (2020.01) |
| H01G 2/00 | (2006.01) |

(52) U.S. Cl.
CPC .......... *G06F 30/3323* (2020.01); *H01G 2/00* (2013.01); *G06F 30/3308* (2020.01); *G06F 30/337* (2020.01); *G06F 30/367* (2020.01); *G06F 30/398* (2020.01)

(58) Field of Classification Search
CPC ............. G06F 30/3323; G06F 30/3308; G06F 30/337; G06F 30/367; G06F 30/398; H01G 2/00
USPC .................... 716/107, 136, 111, 106; 703/14
See application file for complete search history.

(56) References Cited

U.S. PATENT DOCUMENTS

| | | | |
|---|---|---|---|
| 11,288,431 B2 * | 3/2022 | Jiang | ........................ G06F 30/39 |
| 11,487,925 B1 * | 11/2022 | Weng | .................... G06F 30/333 |

(Continued)

FOREIGN PATENT DOCUMENTS

EP             810663 A1 *  12/1997  ......... H01L 27/0805

*Primary Examiner* — Phallaka Kik
(74) *Attorney, Agent, or Firm* — Cooper Legal Group, LLC

(57) ABSTRACT

A design method applied to a capacitor array is provided. The capacitor array includes multiple preset capacitor units, and each preset capacitor includes multiple unit capacitors. The method includes: acquiring unit simulation models of the preset capacitor units; acquiring a first simulation model of the capacitor array based on an arrangement manner of the preset capacitor units in the capacitor array and the unit simulation models of the preset capacitor unit; acquiring an arrangement direction of the preset capacitor units based on the arrangement manner, establishing a parasitic resistance equivalent test structure of a group of preset capacitor units in the same arrangement direction; obtaining a parasitic resistance of each preset capacitor unit based on the parasitic resistance equivalent test structure; and establishing a second simulation model representing the capacitor array based on the parasitic resistance of each preset capacitor unit and the first simulation model.

10 Claims, 7 Drawing Sheets

(56) References Cited

U.S. PATENT DOCUMENTS

| | | | |
|---|---|---|---|
| 2005/0108672 A1* | 5/2005 | Teene | G06F 30/367 716/113 |
| 2009/0113356 A1* | 4/2009 | Rewienski | G06F 30/367 716/132 |
| 2021/0279394 A1* | 9/2021 | Jiang | G06F 30/367 |

* cited by examiner

METHOD

CROSS-REFERENCE TO RELATED APPLICATIONS

The present application is a continuation of International Application No. PCT/CN2021/107970, filed on Jul. 22, 2021, which is based upon and claims priority to Chinese Patent Application No. 202011062989.0, filed on Sep. 30, 2020 and entitled "Design Method". The contents of International Application No. PCT/CN2021/107970 and Chinese Patent Application No. 202011062989.0 are hereby incorporated by reference in their entireties.

BACKGROUND

A semiconductor memory is an indispensable component of a modern electronic system. Multiple unit capacitors are disposed in the semiconductor memory. The unit capacitors of the same row are coupled to one word line structure. The unit capacitors of the same column are coupled to one bit line structure. The performance of the unit capacitors is crucial to the performance of the formed semiconductor memory.

At present, for the designed semiconductor memory, pre-circuit simulation and post-layout simulation are needed to ensure performance parameters of the formed semiconductor memory.

However, a capacitor simulation model in the semiconductor memory is an inaccurate device model at present, resulting in large errors in a simulation result of the semiconductor memory.

SUMMARY

The present disclosure relates to the field of memories, and particularly, to a design method.

The embodiment of the present disclosure provides a design method, which is applied to a capacitor array including multiple preset capacitor units. Each preset capacitor unit includes multiple unit capacitors. The design method includes: acquiring unit simulation models of the preset capacitor units for representing capacitances of the preset capacitor units; acquiring a first simulation model of the capacitor array based on an arrangement manner of the preset capacitor units in the capacitor array and the unit simulation models of the preset capacitor units, the first simulation model being used to represent the corresponding capacitance of each preset capacitor unit in the capacitor array and the arrangement manner of the preset capacitor units; acquiring an arrangement direction of the preset capacitor units based on the arrangement manner of the preset capacitor units, and establishing a parasitic resistance equivalent test structure of a group of preset capacitor units in the same arrangement direction; and obtaining a parasitic resistance of each preset capacitor unit based on the parasitic resistance equivalent test structure, and establishing a second simulation model representing the capacitor array based on the parasitic resistance of each preset capacitor unit and the first simulation model.

BRIEF DESCRIPTION OF THE DRAWINGS

One or more embodiments are illustrated by way of example in the corresponding figures of the accompanying drawings. The figures of the accompanying drawings are not to scale unless otherwise indicated.

DETAILED DESCRIPTION

A capacitor simulation model in a semiconductor memory is an inaccurate device model at present, resulting in large errors in a simulation result of the semiconductor memory.

An embodiment of the present disclosure provides an accurate capacitor device model to improve the accuracy and reliability of a simulation result of a semiconductor memory.

In order to solve the above-described problem, the embodiment of the present disclosure provides a design method, which is applied to a capacitor array. The capacitor array includes multiple preset capacitor units. Each preset capacitor unit includes multiple unit capacitors. The design method includes the following steps. Unit simulation models of the preset capacitor units for representing capacitances of the preset capacitor units are acquired. A first simulation model of the capacitor array is acquired based on an arrangement manner of the preset capacitor units in the capacitor array and the unit simulation models of the preset capacitor units. The first simulation model is used to represent the corresponding capacitance of each preset capacitor unit in the capacitor array and the arrangement manner of the preset capacitor units. An arrangement direction of the preset capacitor units is acquired based on the arrangement manner of the preset capacitor units, and a parasitic resistance equivalent test structure of a group of preset capacitor units in the same arrangement direction is established. A parasitic resistance of each preset capacitor unit is obtained based on the parasitic resistance equivalent test structure. A second simulation model representing the capacitor array is established based on the parasitic resistance of each preset capacitor unit and the first simulation model.

In order to make the objectives, technical solutions, and advantages of the embodiments of the present disclosure clearer, the embodiments of the present disclosure will be described in detail below with reference to the accompanying drawings. However, those of ordinary skilled in the art will appreciate that in various embodiments of the present disclosure, numerous technical details are set forth in order to provide readers with a better understanding of the present disclosure. However, even without these technical details and various changes and modifications based on the following embodiments, the claimed technical solution of the present disclosure may be implemented. The following divisions of the various embodiments are for convenience of description and should not be construed as limiting specific implementations of the present disclosure, and the various embodiments may be combined and cited with each other without contradiction.

The present embodiment is applied to a capacitor array including multiple preset capacitor units. Each preset capacitor unit includes multiple unit capacitors.

Figure 1:
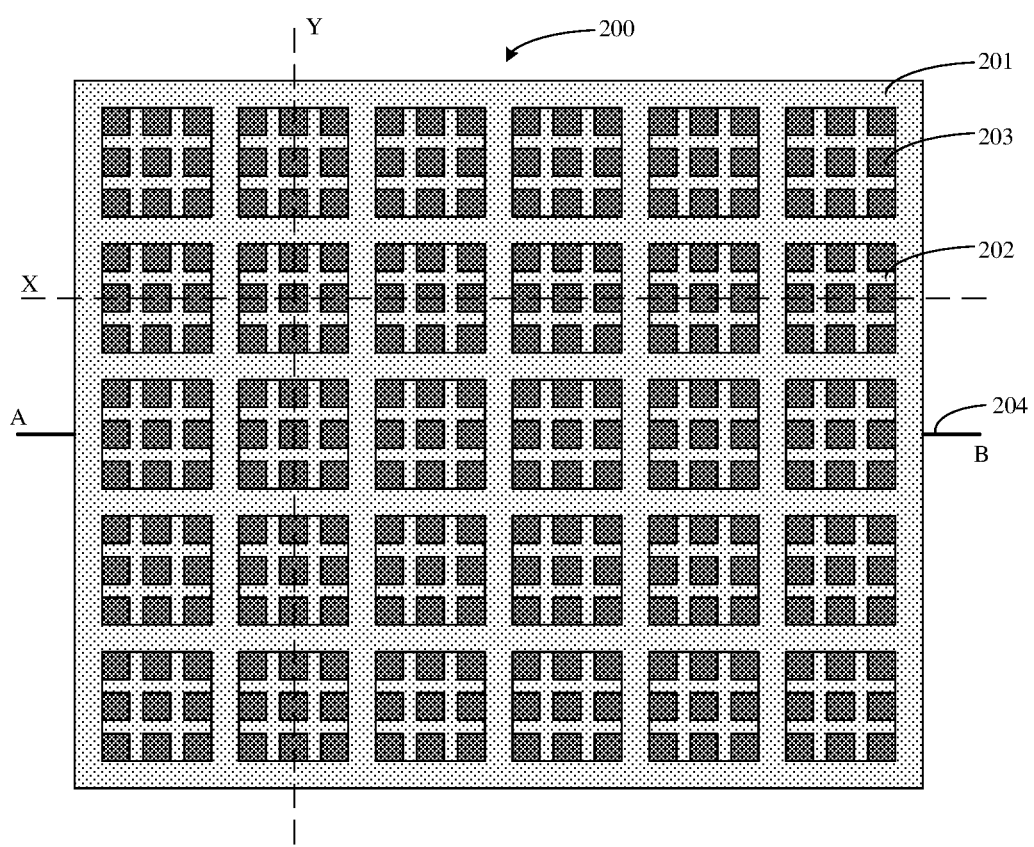
FIG. 1 is a structural schematic diagram of a capacitor array according to an embodiment of the present disclosure.

In an example, referring to FIG. 1, unit capacitors 203 are distributed in a matrix, specifically in a 3*3 matrix array, to form a preset capacitor unit 202. The preset capacitor unit 202 couples the unit capacitors 203 into a whole through a conductive layer 201. The preset capacitor units 202 are distributed in a matrix, specifically in a 6*5 matrix array, to form a capacitor array 200. The capacitor array 200 couples the preset capacitor units 202 into a whole through the conductive layer 201. The conductive wires 204 are connected to the lower electrodes of the preset capacitor units 202 for simulating the capacitor array 200 as a whole capacitor.

Figure 5:
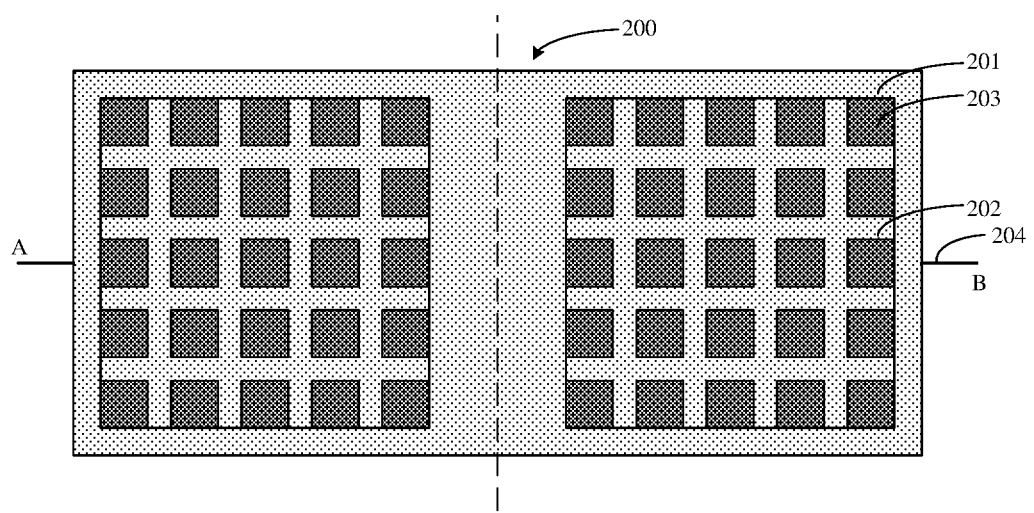
FIG. 5 is a structural schematic diagram of a capacitor array for calculating a parasitic resistance according to an embodiment of the present disclosure.

In the present embodiment, referring to FIG. 5, unit capacitors 203 are distributed in a matrix, specifically in a 5*5 matrix array, to form a preset capacitor unit 202. The preset capacitor unit 202 couples the unit capacitors 203 into a whole through a conductive layer 201. A capacitor array 200 includes two preset capacitor units 202. The capacitor array 200 couples the preset capacitor units 202 into a whole through the conductive layer 201. The conductive wires 204 are connected to the lower electrodes of the preset capacitor units 202 for simulating the capacitor array 200 as a whole capacitor.

It is to be understood that forming the preset capacitor unit 202 by the unit capacitors 203 distributed in a matrix and forming the capacitor array 200 by the preset capacitor units 202 distributed in a matrix in the present embodiment are merely introductions to the capacitor array 200 and the preset capacitor unit 202, and do not limit the capacitor array 200 and the preset capacitor unit 202. A specific calculation manner of the design method in the present embodiment is described on the basis of a specific structure so as to enable a person skilled in the art to understand an implementation of the present embodiment. In a specific application, a corresponding first simulation model may be established according to an actual arrangement manner of the unit capacitors 203 and the preset capacitor units 202.

Figure 2:
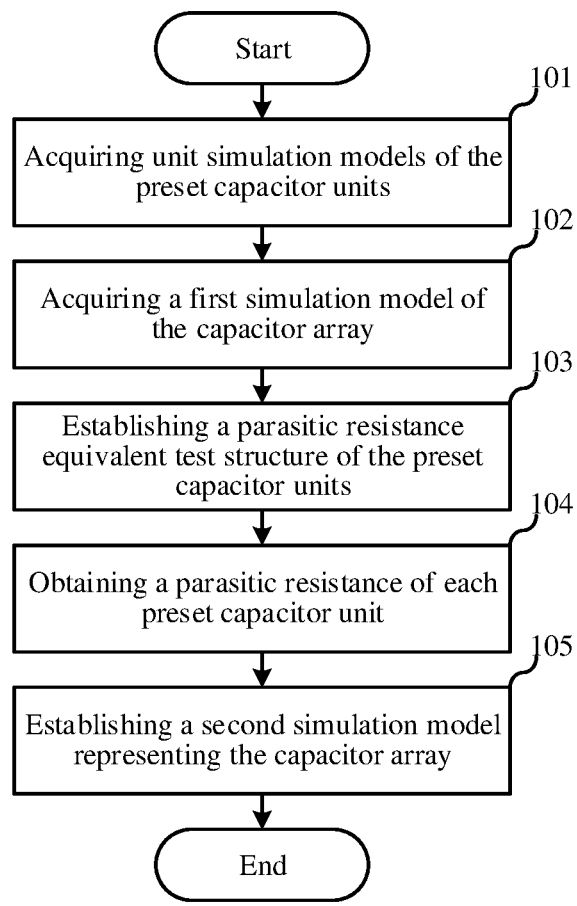
FIG. 2 is a schematic flowchart of a design method according to an embodiment of the present disclosure.

FIG. 2 is a schematic flowchart of a design method according to an embodiment of the present disclosure. The design method of the present embodiment is described in detail below.

Referring to FIG. 2 in conjunction with FIG. 5, the design method includes the steps 101 to 105.

In step 101, the unit simulation models of the preset capacitor units 202 are acquired.

The unit simulation models of the preset capacitor units 202 for representing capacitances of the preset capacitor units 202 are acquired. Specifically, the unit simulation models are acquired based on the number of the unit capacitors 203 in the preset capacitor units 202 and ideal capacitances of the unit capacitors 203.

In the present embodiment, referring to FIG. 5, one preset capacitor unit 202 includes 25 unit capacitors 203. The 25 unit capacitors 203 have the same capacitance. A unit simulation model is used to represent that the capacitance of one preset capacitor unit 202 is 25 times ideal capacitances of the unit capacitor 203. In other embodiments, if the 25 unit capacitors have different capacitances, a unit simulation model is used to represent that the capacitance of one preset capacitor unit is the sum of ideal capacitances of the 25 unit capacitors.

In step 102, a first simulation model of a capacitor array is acquired.

A first simulation model of the capacitor array 200 is acquired based on an arrangement manner of the preset capacitor units 202 in the capacitor array 200 and the unit simulation models of the preset capacitor units 202. The first simulation model is used to represent the corresponding capacitance of each preset capacitor unit 202 in the capacitor array 200 and the arrangement manner of the preset capacitor units 202.

Specifically, a connection relation of the preset capacitor units 202 is acquired according to the arrangement manner of the preset capacitor units 202 in the capacitor array 200, and a first simulation model of the capacitor array 200 is acquired based on the connection relation of the preset capacitor units 202 and the unit simulation models of the preset capacitor units 202.

Referring to FIG. 3 to FIG. 6, in the present embodiment, the first simulation model and the second simulation model are established by taking the capacitor array 200 including two preset capacitor units 202 as an example. It is to be understood that the capacitor array 200 including two preset capacitor units 202 is merely an example for establishing the first simulation model and the second simulation model in the present embodiment, and does not limit the present embodiment. In other embodiments, the first simulation model and the second simulation model may be established according to the number of preset capacitor units in an actual capacitor array.

In the present embodiment, the arrangement direction of the preset capacitor units 202 is defined as an X direction. A Y direction is perpendicular to the arrangement direction of the preset capacitor units 202.

Figure 3:
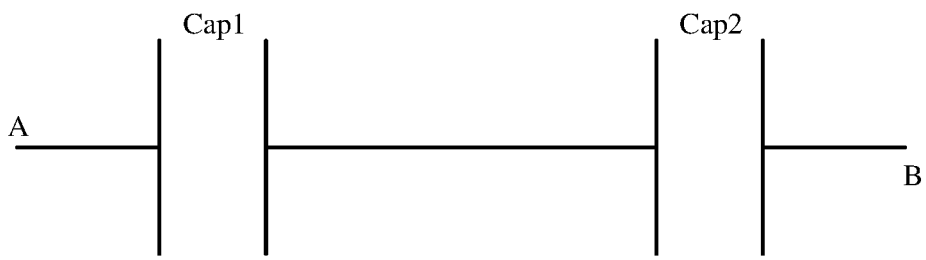
FIG. 3 is a structural schematic diagram of a first simulation model according to an embodiment of the present disclosure.

Specifically, referring to FIG. 3, a unit simulation model of each preset capacitor unit 202 in the capacitor array 200 is acquired, and the unit simulation models of two preset capacitor units 202 are connected in series to form a first simulation model of the capacitor array 200. The first simulation model includes a first preset capacitor unit Cap1 and a second preset capacitor unit Cap2. The first preset capacitor unit Cap1 is used to represent the capacitance of the first preset capacitor unit. The second preset capacitor unit Cap2 is used to represent the capacitance of the second preset capacitor unit.

It is to be understood that in other embodiments, if the capacitor array includes preset capacitor units arranged in rows and columns, arrangement directions of preset capacitors need to be determined according to a connection direction of the conductive wires. That is, an X direction and a Y direction are determined. The unit simulation models of the preset capacitor units are coupled in series in the X direction. The simulation models of the preset capacitor units are coupled in parallel in the Y direction.

With continued reference to FIG. 2, in step 103, a parasitic resistance equivalent test structure of the preset capacitor units is established.

An arrangement direction of the preset capacitor units 202, i.e. the X direction, is acquired based on the arrangement manner of the preset capacitor units 202, and a parasitic resistance equivalent test structure of a group of preset capacitor units 202 in the same arrangement direction is established. That is, a parasitic resistance equivalent test structure of a group of preset capacitor units 202 in the X direction is established.

Figure 4:
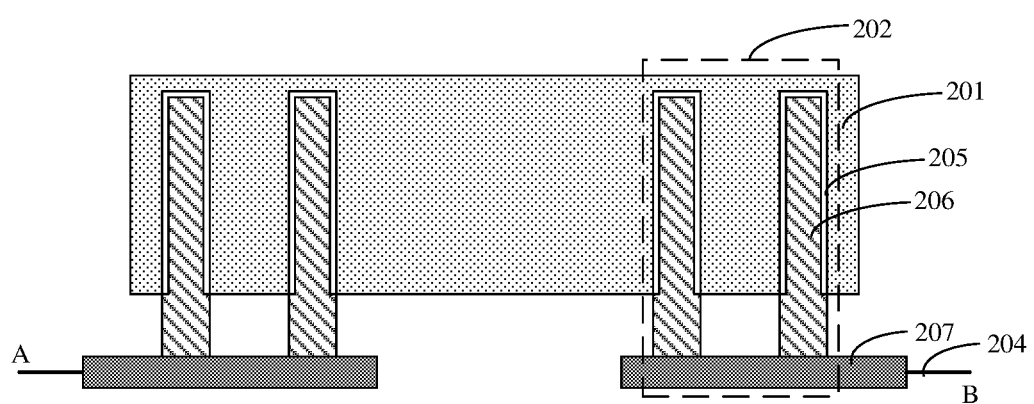
FIG. 4 is a structural schematic diagram of a parasitic resistance equivalent test structure according to an embodiment of the present disclosure.

Specifically, referring to FIG. 4 and FIG. 5, the conductive wires 204 are established. Each conductive wire 204 is coupled to the lower electrodes 206 of the respective preset capacitor unit 202. In the present embodiment, the conductive wire 204 is coupled to the lower electrodes 206 of the preset capacitor unit 202 via a bottom conductive layer 207. That is, the bottom conductive layer 207 is a capacitor landing pad structure in a memory for changing the arrangement manner of the unit capacitors.

A conductive layer 201 is established. The preset capacitor units 202 are disposed in the conductive layer 201. The conductive layer 201 couples upper electrodes 205 of a group of preset capacitor units 202 in the same arrangement direction in series to each other.

Referring to FIG. 4, it is to be understood that in a specific capacitor structure, there is also a capacitor dielectric layer between the upper electrodes 205 and the lower electrodes 206, but the capacitor dielectric layer is not relevant to the contents of the present embodiment, and therefore is not identified in the drawings. It will be clear to a person skilled in the art that there is also a capacitor dielectric layer between the upper electrodes 205 and the lower electrodes 206 in the case of a complete capacitor structure.

Based on the conductive layer 201 and the conductive wires 204, a parasitic resistance equivalent test structure is acquired by using the conductive wires 204 of the preset capacitor units 202 in a group of preset capacitor units 202 as end points respectively.

With continued reference to FIG. 2, in step 104, a parasitic resistance of each preset capacitor unit is obtained.

The parasitic resistance of the preset capacitor unit 202 is acquired based on the parasitic resistance equivalent test structure.

Specifically, referring to FIG. 5, one of the preset capacitor units 202 is selected as a target preset capacitor unit in the capacitor array 200, and a preset interface of the conductive layer 201, on which an adjacent preset capacitor unit 202 is located, is used as a separation interface (illustrated by a dotted line in the figure) to define an equivalent conductive layer of the preset capacitor units 202.

It is to be understood that if the number of a group of preset capacitor units 202 in the X direction is greater than or equal to 3, the remaining preset capacitor units 202 define an equivalent conductive layer through separation interfaces located at both sides except for two preset capacitor units 202 at an edge, and an equivalent conductive layer is defined by a separation interface located at one side and an edge of the conductive layer 201 for equivalent conductive layers located at both sides of the edge.

In the present embodiment, the preset interface is a middle line interface of the conductive layer 201 on which adjacent preset capacitor units 202 are located. The middle line interface of the conductive layer 201 is taken as a preset interface, so that the acquired parasitic resistance of the preset capacitor unit 202 is more accurate.

Figure 6:
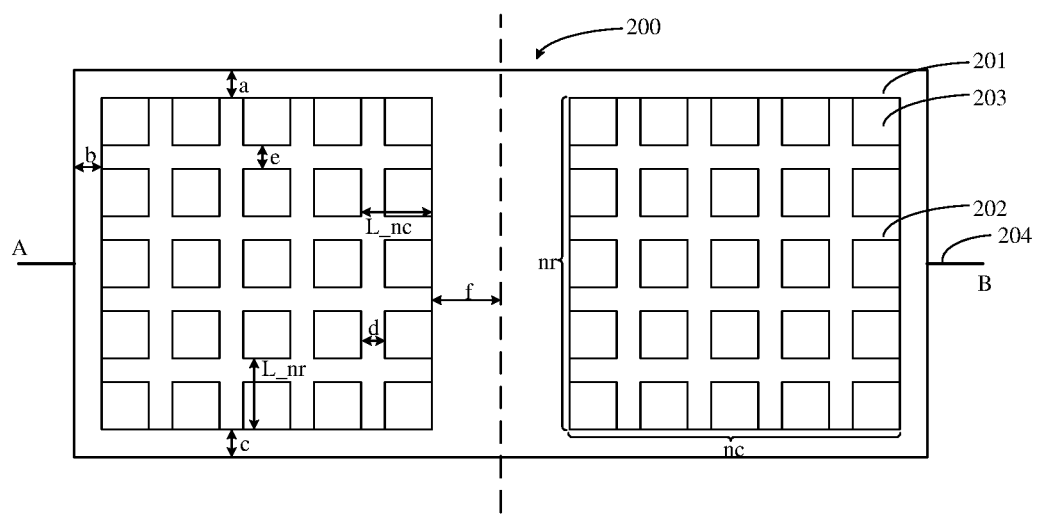
FIG. 6 is a schematic parameter diagram of a capacitor array for calculating a parasitic resistance according to an embodiment of the present disclosure.

Referring to FIG. 6, the present embodiment is specifically described with the case where the left preset capacitor unit 202 is the target preset capacitor unit.

The minimum distances between a boundary of the target preset capacitor unit and a boundary of the equivalent conductive layer on which the target preset capacitor unit is located is acquired in the arrangement direction of the preset capacitor units 202, i.e., the X direction.

In the arrangement direction of the preset capacitor units 202, a first side minimum distance b and a second side minimum distance f between the boundary of the target preset capacitor unit and the separation boundary are acquired. The first side minimum distance b is close to a left end point A, and the second side minimum distance is far away from the left end point A. In the present embodiment, since the present embodiment is specifically described with the case where the capacitor array 200 includes two preset capacitor units 202. There is no separation boundary on the side of the target preset capacitor unit close to the end point A, but there is the boundary of the equivalent conductive layer. At this moment, the first side minimum distance b is acquired by taking the boundary of the equivalent conductive layer as the separation boundary.

The minimum spacings between the boundary of the target preset capacitor unit and the boundary of the equivalent conductive layer is acquired in a direction perpendicular to the arrangement direction of the preset capacitor units 202, i.e., the Y direction.

A first minimum spacing a between an upper boundary of the target preset capacitor unit and an upper boundary of the equivalent conductive layer is acquired and a second minimum spacing b between a lower boundary of the target preset capacitor unit and a lower boundary of the equivalent conductive layer is acquired in the direction perpendicular to the arrangement direction of the preset capacitor units 202.

The characteristic quantities of the unit capacitors in the target preset capacitor unit is acquired in the arrangement direction of the preset capacitor units 202 and a direction perpendicular to the arrangement direction of the preset capacitor units 202. The characteristic quantities include the number of the unit capacitors, the spacings between the unit capacitors, and a line width of each unit capacitor.

Specifically, referring to FIG. 6, the characteristic quantities include nc, L_nc, nr, L_nr, d, and e.

nc is the number of the unit capacitors in the X direction, L_nc is a line width of the unit capacitors in the X direction, and d is a spacing between the unit capacitors in the X direction. nr is the number of the unit capacitors in the Y direction, L_nr is a line width of the unit capacitors in the Y direction, and e is a spacing between the unit capacitors in the Y direction.

A parasitic resistance R of the target preset capacitor unit is acquired based on the minimum distances and the characteristic quantities.

Specifically, the parasitic resistance of the target preset capacitor unit is acquired based on the following formula:

$$R=Rtcp*(L\_nc*nc/2+b/2+f-d)/(L\_nr*nr+a+c-e).$$

R is the parasitic resistance, and Rtcp is a resistivity of the equivalent conductive layer, i.e., a resistivity of the conductive layer 201. b is the first side minimum distance, and f is the second side minimum distance. nc is the number of the unit capacitors in the X direction, L_nc is a line width of the unit capacitors in the X direction, and d is a spacing between the unit capacitors in the X direction. nr is the number of the unit capacitors in the Y direction, L_nr is a line width of the unit capacitors in the Y direction, and e is a spacing between the unit capacitors in the Y direction. a and c are minimum spacings between the boundary of the target preset capacitor unit and a boundary of the capacitor array in the Y direction.

Based on the minimum distances and the characteristic quantities defined in the X direction and the Y direction, the formula for acquiring the parasitic capacitance R is applicable to the capacitor array 200 in any arrangement manner. In the capacitor array 200 in any arrangement manner, since there are at least two conductive wires 204, the parasitic resistance equivalent test structure is determined through the conductive wires 204, so that the X direction and the Y direction are determined. It is ensured that there are only one X direction and one Y direction in the capacitor array 200, thereby ensuring the applicability of the formula for acquiring the parasitic capacitance R.

The above steps are repeated to acquire the parasitic resistance of each preset capacitor unit 202 in the capacitor array 200 to construct a second simulation model of the capacitor array 200.

With continued reference to FIG. 2, in step 105, a second simulation model representing the capacitor array is established.

A second simulation model representing the capacitor array is established based on the parasitic resistance of each preset capacitor unit 202 and the first simulation model.

Specifically, each preset capacitor unit 202 in the first simulation model is coupled in series to a corresponding parasitic resistor to acquire the second simulation model.

Figure 7:
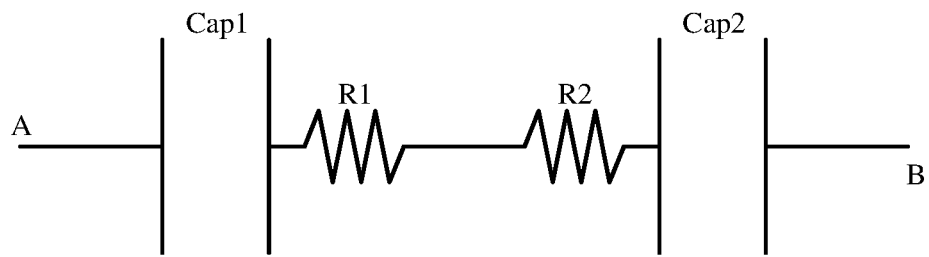
FIG. 7 is a structural schematic diagram of a second simulation model according to an embodiment of the present disclosure.

Referring to FIG. 7, based on the first simulation model acquired in FIG. 3, the first simulation model includes a first preset capacitor unit Cap1 and a second preset capacitor unit Cap2. A first resistor R1 is the parasitic resistance of the first preset capacitor unit Cap1 calculated according to step 104, and a second resistor R2 is the parasitic resistance of the second preset capacitor unit Cap2 calculated according to step 104. The first resistor R1 is coupled in series to the first preset capacitor Cap1 and the second resistor R2 is coupled in series to the second preset capacitor unit Cap2 to form a second simulation model. The second simulation model improves the accuracy and reliability of a simulation result of a semiconductor memory in consideration of the performance influence of the parasitic resistance of the preset capacitor unit 202 on the formed memory.

Compared with the related art, a first simulation model of a capacitor array is acquired for representing capacitances of preset capacitor units in the capacitor array and an arrangement manner of the preset capacitor units. A parasitic resistance equivalent test structure of the preset capacitor units is established based on the arrangement manner of the preset capacitor units to acquire parasitic resistances of the preset capacitor units. A second simulation model is acquired based on the parasitic resistance of each preset capacitor unit and the first simulation model. In combination with the parasitic resistances of the preset capacitor units and the first simulation model, the second simulation model improves the accuracy and reliability of a simulation result of a semiconductor memory in consideration of the performance influence brought by the parasitic resistances in a newly designed simulation model.

The above division of various steps is merely for clarity of description. During implementation, the steps may be combined into one step or some steps may be split and decomposed into multiple steps, which may be within the scope of protection of this patent as long as the same logical relationship is included. It is within the scope of protection of this patent to add insignificant modifications to the process or to introduce insignificant designs without changing the core design of the process.

It is to be understood by those of ordinary skilled in the art that the various embodiments described above are specific embodiments for implementing the present disclosure and that various changes in form and details may be made in practice without departing from the spirit and scope of the present disclosure.

INDUSTRIAL APPLICABILITY

The embodiment of the present disclosure provides a design method, which is applied to a simulation test of a capacitor array including multiple preset capacitor units. According to the design method provided by the embodiment of the present disclosure, a parasitic resistance equivalent test structure of preset capacitor units is established by acquiring a first simulation model of a capacitor array, so as to acquire parasitic resistances of the preset capacitor units. And a second simulation model is acquired based on the parasitic resistance of each preset capacitor unit and the first simulation model. The method may improve the accuracy and reliability of a simulation result of a semiconductor memory in consideration of the performance influence brought by the parasitic resistances.

The invention claimed is:

1. A design method, applied to a capacitor array comprising a plurality of preset capacitor units, each of the preset capacitor units comprising a plurality of unit capacitors, the design method comprising:
   acquiring unit simulation models of the preset capacitor units for representing capacitances of the preset capacitor units;
   acquiring a first simulation model of the capacitor array based on an arrangement manner of the preset capacitor units in the capacitor array and the unit simulation models of the preset capacitor units, the first simulation model being used to represent a corresponding capacitance of each of the preset capacitor units in the capacitor array and the arrangement manner of the preset capacitor units;
   acquiring an arrangement direction of the preset capacitor units based on the arrangement manner of the preset capacitor units, establishing a parasitic resistance equivalent test structure of a group of preset capacitor units in a same arrangement direction;
   obtaining a parasitic resistance of each of the preset capacitor units based on the parasitic resistance equivalent test structure; and
   establishing a second simulation model representing the capacitor array based on the parasitic resistance of each of the preset capacitor units, and the first simulation model.

2. The design method of claim 1, wherein establishing the parasitic resistance equivalent test structure of the group of preset capacitor units in the same arrangement direction comprises:
   establishing conductive wires coupled to lower electrodes of the preset capacitor units;
   establishing a conductive layer, the preset capacitor units being disposed in the conductive layer and the conductive layer coupling upper electrodes of the group of preset capacitor units in the same arrangement direction in series to each other; and
   obtaining, based on the conductive wires and the conductive layer, the parasitic resistance equivalent test structure by using the conductive wires of the preset capacitor units in the group of preset capacitor units as end points respectively.

3. The design method of claim 2, wherein the preset capacitor units in the capacitor array are distributed in a matrix.

4. The design method of claim 3, wherein obtaining the parasitic resistance of each of the preset capacitor units based on the parasitic resistance equivalent test structure comprises:
   selecting one of the preset capacitor units as a target preset capacitor unit, defining an equivalent conductive layer of the preset capacitor units by using a preset interface of the conductive layer, on which adjacent preset capacitor units are located, as a separation boundary;

acquiring minimum distances between a boundary of the target preset capacitor unit and a boundary of the equivalent conductive layer on which the target preset capacitor unit is located;

acquiring characteristic quantities of the unit capacitors in the target preset capacitor unit in the arrangement direction of the preset capacitor units and a direction perpendicular to the arrangement direction of the preset capacitor units, the characteristic quantities comprising a number of the unit capacitors, spacings between the unit capacitors, and a line width of each of the unit capacitor; and acquiring a parasitic resistance of the target preset capacitor unit based on the minimum distances and the characteristic quantities.

5. The design method of claim 4, wherein acquiring the minimum distances between the boundary of the target preset capacitor unit and the boundary of the equivalent conductive layer on which the target preset capacitor unit is located comprises:

acquiring a first side minimum distance and a second side minimum distance between the boundary of the target preset capacitor unit and the separation boundary, the first side minimum distance being close to a corresponding one of the end points, and the second side minimum distance being far away from the corresponding one of the end points; and acquiring minimum spacings between the boundary of the target preset capacitor unit and boundaries of both sides of the equivalent conductive layer in the direction perpendicular to the arrangement direction of the preset capacitor units.

6. The design method of claim 5, wherein acquiring the parasitic resistance of the target preset capacitor unit based on the minimum distances and the characteristic quantities comprises:

acquiring the parasitic resistance of the target preset capacitor unit based on a following formula:

$R = Rtcp*(L\_nc*nc/2+b/2+f-d)/(L\_nr*nr+a+c-e)$; and defining the arrangement direction of the preset capacitor units as an X direction, a Y direction being perpendicular to the arrangement direction of the preset capacitor units;

wherein R is the parasitic resistance, and Rtcp is a resistivity of the equivalent conductive layer;

b is the first side minimum distance, and f is the second side minimum distance;

nc is a number of the unit capacitors in the X direction, $L\_nc$ is a line width of the unit capacitors in the X direction, and d is a spacing between the unit capacitors in the X direction;

nr is a number of the unit capacitors in the Y direction, $L\_nr$ is a line width of the unit capacitors in the Y direction, and e is a spacing between the unit capacitors in the Y direction; and a and c are minimum spacings between the boundary of the target preset capacitor unit and a boundary of the capacitor array in the Y direction.

7. The design method of claim 4, wherein the preset interface is a middle line interface of the conductive layer on which the adjacent preset capacitor units are located.

8. The design method of claim 1, wherein the unit capacitors are distributed in a matrix.

9. The design method of claim 1, wherein acquiring the unit simulation models of the preset capacitor units comprises:

acquiring the unit simulation models based on a number of the unit capacitors in the preset capacitor units and ideal capacitances of the unit capacitors.

10. The design method of claim 1, wherein establishing the second simulation model representing the capacitor array based on the parasitic resistance of each of the preset capacitor units and the first simulation model comprises:

acquiring the second simulation model by coupling each of the preset capacitor units in the first simulation model in series to a corresponding parasitic resistor.

* * * * *